June 18, 1968 H. SCHOEN ETAL 3,389,222
CIRCUIT ARRANGEMENT FOR CONTROLLING THE AMPLIFICATION
OF CASCADE-CONNECTED TRANSISTOR AMPLIFYING STAGES
Filed April 27, 1964 3 Sheets-Sheet 1

INVENTOR.
HERMAN SCHOEN
JAN J. RIETVELD
BY
AGENT

June 18, 1968 H. SCHOEN ETAL 3,389,222

CIRCUIT ARRANGEMENT FOR CONTROLLING THE AMPLIFICATION OF CASCADE-CONNECTED TRANSISTOR AMPLIFYING STAGES

Filed April 27, 1964 3 Sheets-Sheet 2

INVENTOR.

HERMAN SCHOEN
JAN J. RIETVELD

BY

Frank R. Trifari

AGENT

INVENTORS
HERMANN SCHOEN
JAN J. RIETVELD
BY
Frank R. Trifari
AGENT

United States Patent Office 3,389,222

Patented June 18, 1968

3,389,222

CIRCUIT ARRANGEMENT FOR CONTROLLING THE AMPLIFICATION OF CASCADE-CONNECTED TRANSISTOR AMPLIFYING STAGES

Hermann Schoen, Hamburg, Germany, and Jan Joost Rietveld, Emmasingel, Eindhoven, Netherlands, assignors to North American Philips Company, Inc., New York, N.Y., a corporation of Delaware Filed Apr. 27, 1964, Ser. No. 362,860
Claims priority, application Germany, Apr. 27, 1963, 31,689; July 25, 1963, 32,278
3 Claims. (Cl. 178—7.3)

ABSTRACT OF THE DISCLOSURE

A circuit for controlling the gain of a two stage transistor amplifier with a varying control signal by selectively varying the emitter current in each stage is provided with a first stage transistor having a constant voltage supplied to its base electrode, and an emitter network consisting of a first resistor connected between the source potential and the emitter electrode, a diode, connected to the emitter electrode in a direction passing emitter current, and a second resistor connected between the diode and the end of the first resistor remote from the emitter electrode. The second stage transistor is provided with a constant emitter voltage. The control signal is applied between the second resistor and the diode of the first stage, and to the base electrode of the second stage. The first and second resistors are proportioned such that the emitter current of the first stage will decrease with increasing control signal until the diode cuts off, at which point, the emitter current of the second stage will increase with increasing control current.

The invention relates to circuit arrangements for automatic amplification control and particularly for controlling the amplification of cascade-connected transistor amplifying stages in accordance with a control-magnitude. Such arrangements provide that with a variation of the control-magnitude, only the amplification of one or more of the amplifying stages is reduced by a reduction of emitter current and, with further variations, the amplification of one or more of the further amplifying stages is reduced by an increase in emitter current. Such control-circuits are frequently employed in a closed control-circuit. The control-magnitude is derived from the signal amplified by the series-connected transistor amplifying stages.

It is known to vary the amplification factor of transsistors by varying the emitter current or the collector current. The amplification factor $\alpha$ of a transistor has a maximum with a given value of collector current and also of emitter current. With higher (forward control) and with lower collector currents (reverse control), the amplification factor is reduced. It has been proposed to control the amplification of series-connected transistor stages so that first the amplification of at least one amplifying stage is reduced by reduction of the collector or emitter-current and subsequently the amplification of at least one further amplification stage is reduced by increasing the same. With the circuit arrangements hitherto known for a forward control and reverse control thereof use is made of particular properties of transistors. However, these properties are quite individual and depend upon temperature, so that it is practically not possible to obtain a sufficiently constant final point of the reverse control and an initial point of the forward control.

The primary object of the invention is to provide a circuit arrangement for controlling the amplification of cascade connected transistor amplifying stages by means of a control-magnitude in a manner relatively independent of the individual characteristics of a transistor. The arrangement will provide that with a variation of the control-magnitude only the amplification of at least one amplifying stage is reduced by the reduction of the emitter current and with a further variation of control magnitude, the amplification of at least one further amplifying stage is reduced by an increase of the emitter current.

In accordance with the invention this is achieved with a two stage amplifier, the emitter current of the first stage being reduced, and the emitter current of the second stage being raised, by connecting in parallel with an emitter resistance of the first stage the bias base voltage of which is fixed, the series combination of a diode, conductive for the emitter current, and a parallel resistor, the value of which is lower than the value of the emitter resistance. The parallel resistor is traversed by a control-current flowing in the same direction as the emitter current. The base of the second stage is connected to the junction of the diode and the parallel resistor.

In an alternative embodiment of the invention, when the circuit arrangement is employed for controlling the amplification of at least two stages in a television receiver, the control-current is derived from the synchronising pulses.

The invention will now be described more fully with reference to the accompanying drawings, which shows a few embodiments.

Figure 1:
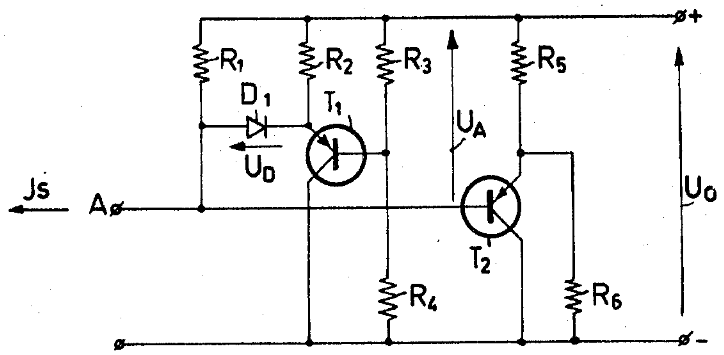
FIG. 1 shows a circuit arrangement according to the invention.

FIG. 1 shows only the direct-current circuit of the two transistor amplifying stages $T_1$ and $T_2$, the emitter currents of which have to be reduced and raised in succession in dependence upon the control-magnitude applied to a point A for reducing the amplification. First the emitter current $I_{E1}$ of the transistor $T_1$ has to be reduced from a rest or initial value to a minimum value and after this value is reached the emitter current $I_{E2}$ of the transistor $T_2$ has to be raised from a rest or normal value.

The base potential of the transistor $T_1$ is fixed by a potentiometer $R_3$, $R_4$ and it has such a value that the voltage drop across the resistor $R_3$ is large with respect to the sum of the forward voltages of the transistor $T_1$ and of the diode $D_1$. The emitter resistance of the transistor $T_1$ consists of the resistor $R_2$, to which is connected the series combination of a resistor $R_1$ and a diode $D_1$. The polarity of the diode is such that it allows the emitter current to pass. The resistor $R_2$ is proportioned so that it has a high resistance value with respect to the resistor $R_1$ and determines the desired minimum emitter current of the reverse-controlled transistor $T_1$ when the diode is cut off.

Figure 2:
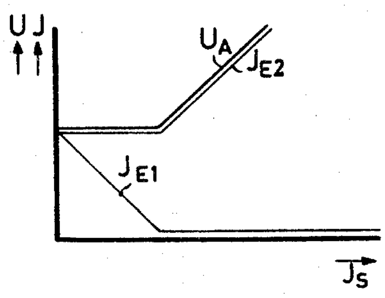
FIG. 2 shows a diagram for explaining the arrangement of FIG. 1.

In the initial state of the control the control-current from a control-current source $I_S=0$. The emitter current of the transistor $T_1$ consists of a small portion passing through the high ohmic resistor $R_2$ and a considerably greater portion passing through the resistor $R_1$ and the diode. The voltage drop across the resistor $R_1$ is only slightly smaller than the constant voltage drop across the resistor $R_3$, the difference being equal to the sum of the emitter-base voltage $U_{ED}$ of the transistor and the base voltage $U_D$ of the diode. This voltage difference remains small as long as the diode is polarised in the forward direction, and the voltage drop across the resistor $R_1$ is thereby similarly constant for the same time. As a result there flows a substantially constant current through the resistor $R_1$, which current is formed by the control-current $I_S$ and part of the emitter current. Owing to the constant voltage any increase in $I_S$ causes an equal decrease in the emitter current $I_{EI}$ and this holds until the diode current has become zero. From this instant the emitter current is determined solely by the resistor $R_2$, so that it is subsequently independent of a further increase in control-current. The variation of the emitter current $I_{E1}$ of the transistor $T_1$ is illustrated in FIG. 2. This figure also illustrates the variation of the voltage $U_A$ across the resistor $R_1$. When the diode current is zero, the voltage $U_A$ is no longer determined by the diode and it increases proportionately to the increase in $I_S$. The voltage across the diode which is in cut off direction thus increases and for this reason the cut-off current of the diode must remain negligibly small with respect to the emitter current determined by $R_2$ under all possible operational conditions, as for example with a higher ambient temperature. If the minimum emitter current lies in the $\mu$ampere region, a silicon diode should be used.

The voltage at point A which increases after the transistor $T_1$ is reverse controlled, is applied by means of a connection to the base of the transistor $T_2$, which is to be forward controlled. The emitter of the transistor $T_2$ is connected through a potentiometer $R_5$, $R_6$ to a bias voltage of a magnitude such that, with the given minimum value of the voltage $U_A$, the desired initial value of the emitter current $I_{E2}$ is adjusted. With an increasing vlotage, after the termination of the reduction of the emitter current $I_{EI}$, the emitter current $I_{E2}$ of the second stage $T_2$ increases.

In this way the arrangement described above provides a very stable, satisfactorily reproduceable control which is particularly independent of temperature owing to the resistor $R_2$ voltage drop which is high relative to the voltage $U_{EB}$ of the transistor $T_1$.

Figure 3:
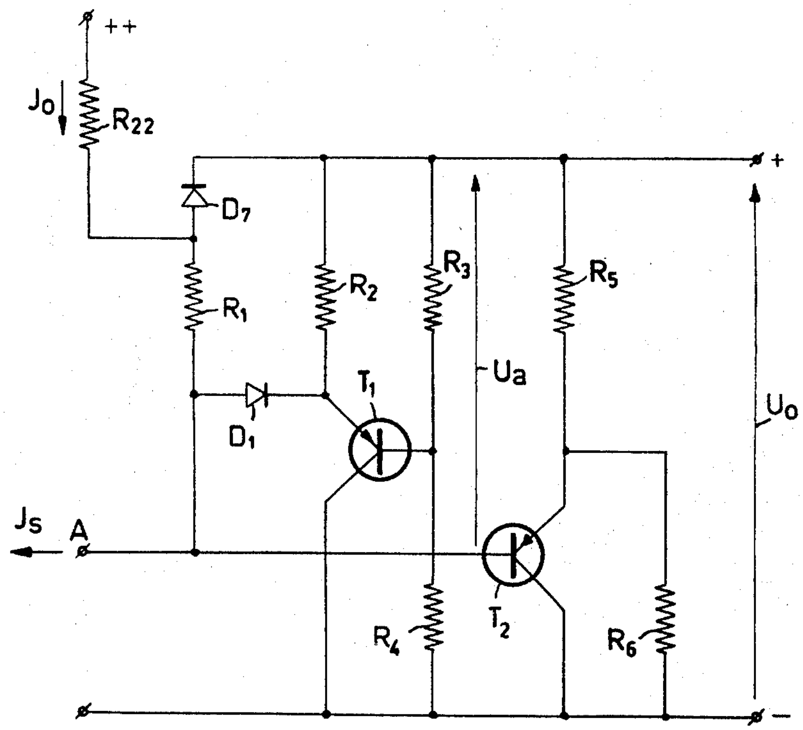
FIG. 3 shows a second circuit arrangement according to the invention.
Figure 4:
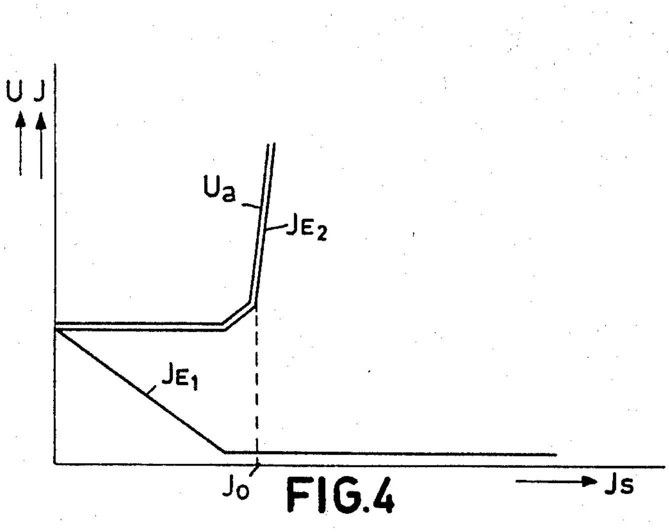
FIG. 4 shows a diagram for explaining the arrangement of FIG. 3.

With reference to FIGS. 3 and 4 a further improvement in the arrangement according to the invention will be described, in which a material reduction of the control-current required for the control of the arrangement is obtained. In FIG. 3 the circuit elements corresponding with those of FIG. 1 are designated by the same references.

As is shown in FIG. 3, the emitter resistance $R_2$ has connected with it in parallel the series combination of the diode $D_1$, a parallel resistor $R_1$ and a diode $D_7$. In the same way as is illustrated in FIG. 1, the diode $D_1$ is polarised so that it allows the emitter current to pass, while the diode $D_7$ is connected in a direction opposite to the direction of the emitter current. The junction of the diode $D_7$ and the parallel resistor $R_1$ receives a constant current $I_0$ across a resistor $R_{22}$, which is great relative to the resistor $R_1$. To this end the resistor $R_{22}$ is connected to a high positive voltage; when the arrangement of FIG. 3 is employed in a television receiver, it is advantageous to apply to the resistor $R_{22}$ the booster voltage available in the line output stage of the receiver.

In the initial state of the control the control-current $I_S$ supplied by a control-current source is equal to zero. With reference to FIG. 1 it is shown above that the emitter current of the transistor $T_1$ consists of a small portion passing through the high-ohmic resistor $R_2$ and a considerably larger portion passing through the resistor $R_1$ and the diode $D_1$. The resistor $R_{22}$ is proportioned so that the bias current $I_0$ slightly exceeds the current passing through the parallel resistor $R_1$. The difference between these two currents passes in the forward direction through the diode $D_7$.

With an increase in the control-current $I_S$, the reverse-control of the transistor $T_1$ is carried out in the manner described with reference to FIG. 1. The variation of the emitter current $I_{E1}$ of the transistor $T_1$ is shown in FIG. 4. This figure also shows the variation of the voltage $U_A$ at the junction of the diode $D_1$ and the resistor $R_1$; this voltage is applied to the base electrode of the forward controlled transistor $T_2$.

When the control-current has increased to the extent that the diode $D_1$ is cut off, the voltage $U_A$ is no longer kept constant, so that it rises proportionately to the control-current $I_s$ passing substantially completely through the resistor $R_1$. The increase of the current through the resistor $R_1$ results in that the difference current through the diode $D_7$ decreases so that the diode $D_7$ is cut off when the control-current has risen to the value of the bias current $I_0$. A further increase in control-current above the value of the bias current then flows through the series combination of the resistors $R_1$ and $R_{22}$ and since the value of the resistor $R_{22}$ is very high, a small rise in control-current already suffices to produce a great variation of the voltage at the base electrode of the transistor $T_2$. Therefore only a small increase in control-current is required for achieving the complete forward control of the transistor $T_2$.

By this measure it is ensured that the power to be supplied by the control-current source is considerably reduced so that a control-current source of lower power may be used.

A circuit arrangement of the type described with reference to FIGS. 1 to 4 may be advantageously used as a control-circuit in a television receiver. In this case the transistor stage in which the amplification has to be reduced by a decrease of emitter current is advantageously formed as an intermediate-frequency amplifying stage in which whereas the stage, the amplification has to be reduced by an increase in the emitter current is formed by a stage of radio frequency amplification, as a tuner. The control-magnitude to be derived in this case from the signal amplified by said stages is preferably obtained from the synchronising pulses.

With reference to FIGS. 5 to 8 a few arrangements for deriving the control-magnitude from the synchronising pulses will be described hereinafter. These arrangements are proportioned so that the total required increase in the control-current $I_S$ is obtained with a minimum amplitude variation of the synchronising pulses. The arrangements receive, apart from the synchronising pulses, blanking pulses for suppressing the control-current during the forward stroke of the line scan.

With all arrangements the control-current $I_S$ is obtained from the collector of an n-p-n transistor. For each of them there is provided a threshold voltage which must be exceeded by the synchronising pulses in order to render the control-current source operative. Since synchronising pulses concerns current pulses having a keying ratio 1:11, integrating means formed by capacitors must be provided at the output of the control-current source in order to obtain a constant control-current.

Figure 5:
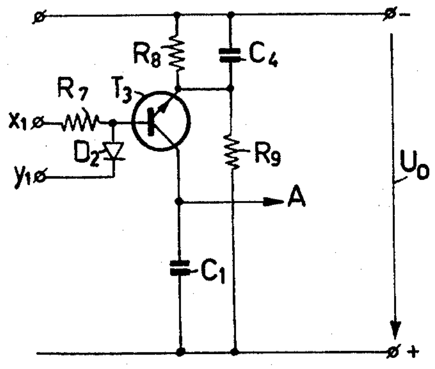
FIG. 5 to 8 show four embodiments of a control-current source for the arrangements shown in FIGS. 1 and 3 and FIGS. 9 and 10 show two arrangements for deriving the synchronising pulses to be applied to the control-current sources of FIGS. 5 to 8.

With the control-current source shown in FIG. 5 the threshold voltage is formed by a potentiometer of the resistors $R_8$ and $R_9$, the lower resistor $R_9$ being connected in parallel with the emitter-collector path of an n-p-n transistor $T_3$. The base of the latter transistor is conrolled from point $x_1$ directly by positive synchronising pulses and from point $y_1$, via a decoupling diode $D_2$, by blanking pulses preferably emanating from the line scan transformer. The polarity of the blanking pulses has to be chosen so that point $y_1$ is negative during the forward line scan with respect to the threshold voltage supplied by the resistors $R_8$ and $R_9$ at the emitter electrode of $T_3$. Thus the diode $D_2$ is opened and the transistor $T_3$ is cut off. The transverse current passing through the potentiometer $R_8$, $R_9$ must be about ten times the maximum value of the control-current in order to reduce the fluctuation of the threshold voltage to a maximum of 10% throughout the control-range. The dynamic internal resistance of the arrangement is strongly reduced by a capacitor $C_4$ of high capacity.

Figure 6:
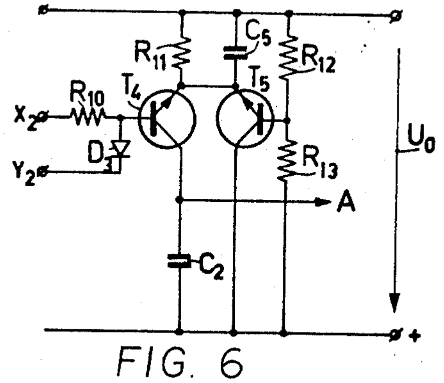
Figure 7:
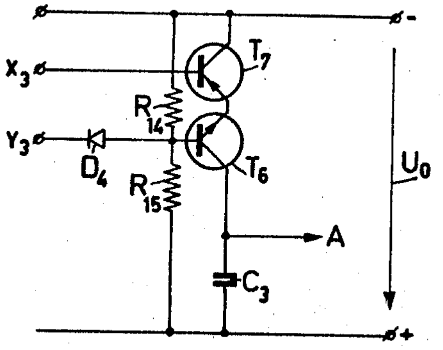

With the control-current source of FIG. 6 two n-p-n transistors $T_4$ and $T_5$ are connected to a difference amplifier. In this arrangement, positive synchronising pulses supplied via point $x_2$ vary the current distribution, while the sum of the two emitter currents remains substantially constant. The resistor $R_9$ of the control-current source potentiometer of FIG. 5 is replaced in this source by a further transistor $T_5$. The average current passing through the common emitter resistor $R_4$ need exceed the maximum control-current $I_S$ by a relatively small amount, so that with respect to the source of FIG. 5 the current consumption is materially reduced.

Accordingly the value of the capacitor $C_5$ is smaller. The transverse current passing through the potentiometer $R_{12}$, $R_{13}$, which determines the base potential of the transistor $T_5$, is negligibly small as compared with the said currents.

With the control-current sources so far described the blanking pulses supplied through points $y_1$ and $y_2$ may react on the points $x_1$ and $x_2$. With the control-current source shown in FIG. 7 this disadvantage is avoided; it comprises two series-connected complementary transistors $T_6$ and $T_7$. In this arrangement a control-current $I_S$ is produced when the base of the p-n-p transistor $T_7$ is negatively biassed with respect to the base of the n-p-n transistor $T_6$. The threshold voltage to be exceeded by the synchronising pulses applied via point $x_3$ is determined by the bias voltage of the base of the transistor $T_7$, which is fixed by the potentiometer $R_{14}$, $R_{15}$. In contrast to the control-current sources of FIGS. 5 and 6 a synchronising signal of negative polarity must be applied to point $x_3$. The blanking pulses are applied to the base of the n-p-n transistor $T_6$ through point $y_3$ and a decoupling diode $D_4$ so that a direct reaction of these pulses at point $x_3$ is not possible.

In this arrangement the functions of the transistors $T_6$ and $T_7$ can be exchanged. The base of the n-p-n transistor $T_6$ then receives positive synchronising pulses, whereas the base of the p-n-p transistor $T_7$ determines the threshold voltage. The blanking pulses are then applied with positive polarity to the base of the transistor $T_7$.

Figure 8:
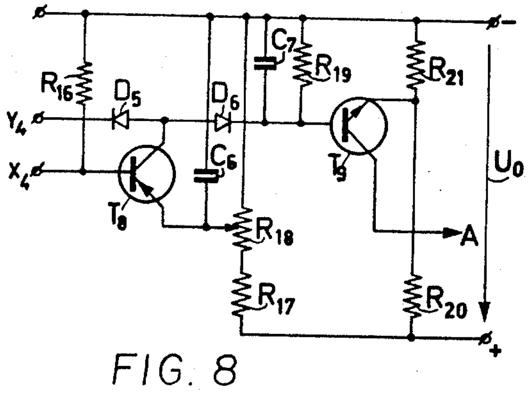

FIG. 8 shows a control-current source wherein the n-p-n transistor $T_9$ and the potentiometer $R_{20}$, $R_{21}$ correspond to those of the control-current source of FIG. 5. As in FIG. 5 the base of the transistor $T_9$ is controlled by the blanking pulses applied to point $y_4$ through a decoupling diode $D_5$. However, in order to improve the control gain of a control-circuit including such a current source, the synchronising pulses are applied to the base of the transistor $T_9$ through a p-n-p transistor $T_8$, instead of being applied directly. The negative synchronising pulses attain the base of this transistor through point $x_4$. When these pulses exceed the threshold determined by the potentiometer $R_{17}$, $R_{18}$ at the emitter of said transistor, the transistor becomes conducting. Then the collector current passes through the diode $D_6$ and the RC-combination $C_7$, $R_{19}$, which integrates the pulsatory current so that the base of the n-p-n transistor receives, through $R_{19}$, a direct voltage with a polarity rendering transistor $T_9$ conducting. With this control-current source the control-steepness obtained is higher by a factor of 10, so that a particularly constant video signal is obtained.

The potentiometer $R_{20}$, $R_{21}$ at the emitter of the transistor $T_9$ must be proportioned so that the emitter of the transistor $T_9$ must be proportioned so that the emitter diode remains cut off when $R_{19}$ is traversed only by the cut-off currents $I_{CBO}$ of the two transistors. Otherwise with high ambient temperatures, a control-current would be produced without the occurrence of an adequate signal at the input $x_4$.

Figure 9:
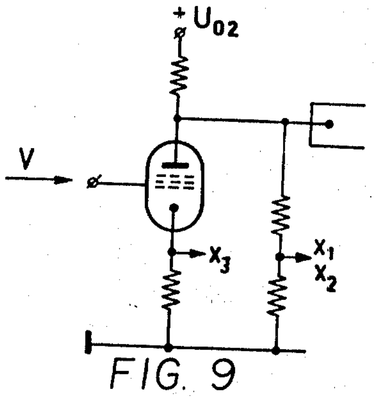
Figure 10:
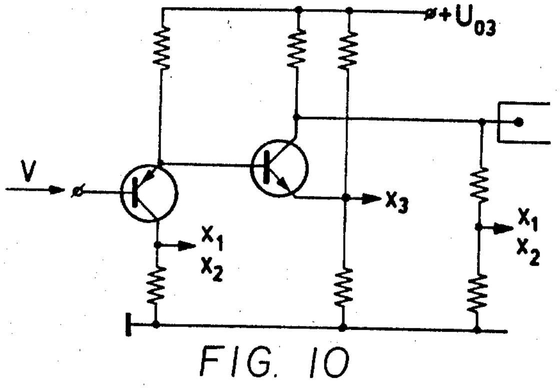

FIGS. 9 and 10 finally show the principal diagram of two video amplifiers with the points from which the synchronising pulses can be obtained with the correct polarities for the separate circuits of FIGS. 5 to 8. The negative terminal of the voltage supply of the arrangements of FIGS. 5 to 8 must be connected to earth. At points $x_3$ of the amplifiers of FIGS. 9 and 10 there appear the synchronising pulses without an additional output. These points also have a sufficiently low dynamic internal resistance.

What is claimed is:

1. A control circuit arrangement including first and second transistor stages, comprising first biasing means for supplying a control current with a range of component levels including a predetermined level and levels above and below said predetermined level, voltage supply means supplying operating potential to said circuit arrangement, first resistance means coupling said voltage supply means to the emitter electrode of said first stage transistor for forming an emitter current path, second biasing means for applying a constant potential to the base electrode of said first stage transistor, means coupling a second resistance means between said voltage supply means and said first stage transistor emitter electrode for forming a further emitter current path for said first stage transistor, said means coupling comprising a unilateral conduction device connected between said second resistance means and said emitter electrode in a direction passing emitter current, means connecting said first biasing means to the junction point of said second resistance means and said unilateral conduction device, said unilateral conduction device being biased by the potential at said first stage emitter electrode and the potential drop across said second resistance means for rendering said device conductive for all levels of control current below said predetermined level and non-conductive for all levels of control current above said pedetermined level, the emitter current of said first stage transistor thereby decreasing for increases of control current from an initial value below said predetermined level up to said predetermined level, means connecting the base electrode of said second stage transistor to said first transistor stage junction point, and third biasing means for applying a potential to the emitter electrode of the second stage transistor whereby the emitter current of said second stage transistor increases in correspondence with increases of control current from said predetermined level.

2. The combination of claim 1 wherein said unilateral conduction device is a diode.

3. The combination of claim 2 wherein a second diode is connected in series with said second resistance means, in a direction opposing the flow of current through said second resistance means, and including means for applying a bias current to said diode for rendering it conductive for values of control current below said predetermined value.

References Cited

UNITED STATES PATENTS

| | | | |
|---|---|---|---|
| 3,061,793 | 10/1962 | Verkruissen | 178—7.5 |
| 3,115,547 | 12/1963 | Tschannen | 178—7.3 |
| 3,225,139 | 12/1965 | Massman | 178—7.3 |

ROBERT L. GRIFFIN, *Primary Examiner.*

JOHN W. CALDWELL, *Examiner.*

R. L. RICHARDSON, *Assistant Examiner.*